US011159127B2

(12) United States Patent
Miller et al.

(10) Patent No.: US 11,159,127 B2
(45) Date of Patent: Oct. 26, 2021

(54) NOISE SUPPRESSING INTERFACE CIRCUIT FOR DEVICE WITH CONTROL CIRCUITS IN DIFFERENT NOISE ENVIRONMENTS

(71) Applicant: Quantum Opus, LLC, Novi, MI (US)

(72) Inventors: Aaron Miller, Novi, MI (US); Timothy Rambo, Livonia, MI (US)

(73) Assignee: QUANTUM OPUS, LLC, Novi, MI (US)

( * ) Notice: Subject to any disclaimer, the term of this patent is extended or adjusted under 35 U.S.C. 154(b) by 224 days.

(21) Appl. No.: 16/399,207

(22) Filed: Apr. 30, 2019

(65) Prior Publication Data

US 2020/0350869 A1 Nov. 5, 2020

(51) Int. Cl.
H03F 1/26 (2006.01)
H03H 7/06 (2006.01)
G01J 1/44 (2006.01)

(52) U.S. Cl.
CPC .................. *H03F 1/26* (2013.01); *G01J 1/44* (2013.01); *H03H 7/06* (2013.01); *G01J 2001/442* (2013.01); *G01J 2001/444* (2013.01); *H03F 2200/165* (2013.01)

(58) Field of Classification Search
CPC ...... H03F 1/26; H03F 2200/165; H03F 19/00; H03F 3/08; H03F 2200/447; H03F 2200/114; H03F 2200/451; H03F 1/30; H03H 7/06; G01J 1/44; G01J 2001/444; G01J 2001/442; G01J 1/0252; G01J 2001/0276; G01J 1/46; G01J 1/42
See application file for complete search history.

(56) References Cited

U.S. PATENT DOCUMENTS

| 4,794,353 | A | 12/1988 | Broyde |
|---|---|---|---|
| 4,980,754 | A | 12/1990 | Kotani et al. |
| 6,188,358 | B1 | 2/2001 | Clynne |
| 6,990,729 | B2 | 1/2006 | Pleskach et al. |

(Continued)

FOREIGN PATENT DOCUMENTS

| EP | 0367630 A1 | 5/1990 |
|---|---|---|
| WO | 2005115531 A2 | 12/2005 |

OTHER PUBLICATIONS

Kadin, et al.; "Current Leads and Optimized Thermal Packaging for Superconducting Systems on Multistage Cryocoolers"; IEEE Transactions on Applied Superconductivity, vol. 17, No. 2, Jun. 2007.

(Continued)

*Primary Examiner* — Thanh Luu
*Assistant Examiner* — Monica T Taba
(74) *Attorney, Agent, or Firm* — Clark Hill PLC; James R. Foley

(57) ABSTRACT

A thermal and environmental noise suppressing interface circuit which is configured to operate cold and is configured to perform biasing with suppression of noise currents from room temperature noise voltages and dc coupled rf readout of a superconducting device under test with a single coaxial cable or equivalent conductor pair. The circuit is configured to suppress the propagation of thermal and environmental noises to/from sensors operating at a different temperature from its operating and control equipment while maintaining a single input-output channel, and provides for the placement of a local grounding impedance on an intercept board.

13 Claims, 1 Drawing Sheet

(56) References Cited

U.S. PATENT DOCUMENTS

| | | |
|---|---|---|
| 7,012,486 B2 | 3/2006 | Ji |
| 7,342,401 B2 | 3/2008 | Knauer |
| 7,427,816 B2 | 9/2008 | Anthony et al. |
| 8,644,029 B1 | 2/2014 | Ji |
| 9,490,112 B2 | 11/2016 | McDermott, III et al. |
| 9,520,180 B1 | 12/2016 | Mukhanov et al. |
| 9,826,622 B2 * | 11/2017 | Kuemmeth .......... G10K 11/162 |
| 2005/0061986 A1 * | 3/2005 | Kardynal ........ H01L 31/035236 |
| | | 250/370.01 |
| 2005/0161749 A1 | 7/2005 | Yang et al. |
| 2012/0077680 A1 | 3/2012 | Berggren et al. |
| 2014/0152413 A1 | 6/2014 | Fu et al. |
| 2014/0299751 A1 | 10/2014 | Tang et al. |
| 2015/0229288 A1 | 8/2015 | Kisner et al. |
| 2016/0028403 A1 | 1/2016 | McCaughan et al. |
| 2017/0025850 A1 | 1/2017 | Rey et al. |
| 2017/0077580 A1 | 3/2017 | Kawaguchi et al. |
| 2018/0145110 A1 | 5/2018 | Zhao et al. |
| 2018/0337324 A1 * | 11/2018 | Fong ....................... G01J 5/046 |

OTHER PUBLICATIONS

Kerman et al.; "Readout of superconducting nanowire single-photon detectors at high count rates"; Journal Applied Physics 113, 144511, 2013.

Cahall et al.; "Multi-photon detection using a conventional superconducting nanowire single-photon detector", Optica 4, 1534; 2017.

International Search Report and Written Opinion That Issued for PCT/US20/28221 dated Jun. 26, 2020.

\* cited by examiner

_(57)_

NOISE SUPPRESSING INTERFACE CIRCUIT FOR DEVICE WITH CONTROL CIRCUITS IN DIFFERENT NOISE ENVIRONMENTS

BACKGROUND

The present invention generally relates to noise suppressing interface circuits and more specifically relates to an interface circuit that is configured to reduce noise from ground loops, external sources of electromagnetic interference, and/or thermal differences between sensors operating at a different temperature from their operating and control equipment while maintaining a single input-output channel.

Typical operation of a cryogenic amplifier with a sensor such as a superconducting nanowire single-photon detector is achieved by placing a cryogenic bias tee between the nanowire and the amplifier, with two electrical lines running to the electrical feedthrough of the cryostat (one for low-frequency bias/dc connections and one for high-frequency rf signals), in addition to the power line required for the amplifier. In other words, separate input and output electrical channels are needed. This is undesirable because the amount of wiring going into/out of a cryostat is often a limiting factor for how many superconducting devices can operate at once (limiting the number of optical channels, or the size of a multi-element detector array).

SUMMARY

An object of an embodiment of the present invention is to provide a noise suppressing interface circuit that is configured to suppress environmental or thermal noises on sensors operating at a different temperature from its operating and control equipment while maintaining a single input-output channel.

Another object of an embodiment of the present invention is to provide an interface circuit that provides for the placement of a local grounding (or alternative return-current path) impedance on an intercept board.

Another object of an embodiment of the present invention is to provide an interface circuit that provides a low-pass filter in a dc-shunt line, which works to remove noise fluctuations propagating from room temperature, allowing for better device performance. A high impedance dc bypass line provides that dc currents induced by metallic connections between two different thermal environments are reduced by the high impedance dc path between those two temperatures, allowing very sensitive device biasing without negative effects from these currents.

Briefly, an embodiment of the present invention provides an interface circuit which is configured to operate cold and is configured to perform biasing with suppression of noise currents from room temperature noise voltages and dc-coupled rf readout of a superconducting device under test with a single coaxial cable or equivalent conductor pair. As a result, wiring cost and complexity is reduced, as is heat loading. The reduction in wiring complexity is extremely important at the present time because cryogenic devices are being scaled to larger and more complex systems, and are being pushed into ever smaller coolers. While all three points are highly relevant, finding the physical space to get all the wiring in is probably the most important limiting factor for determining how small of a cooler can be used or how many devices can be incorporated into a given system. The noise decoupling circuit provides that bias teeing is provided using only one coax for the dc and rf, in addition to a wiring needed to power the amplifier.

BRIEF DESCRIPTION OF THE DRAWINGS

The organization and manner of the structure and operation of the invention, together with further objects and advantages thereof, may best be understood by reference to the following description taken in connection with the accompanying drawings wherein like reference numerals identify like elements in which.

DESCRIPTION OF ILLUSTRATED EMBODIMENTS

Figure 1:
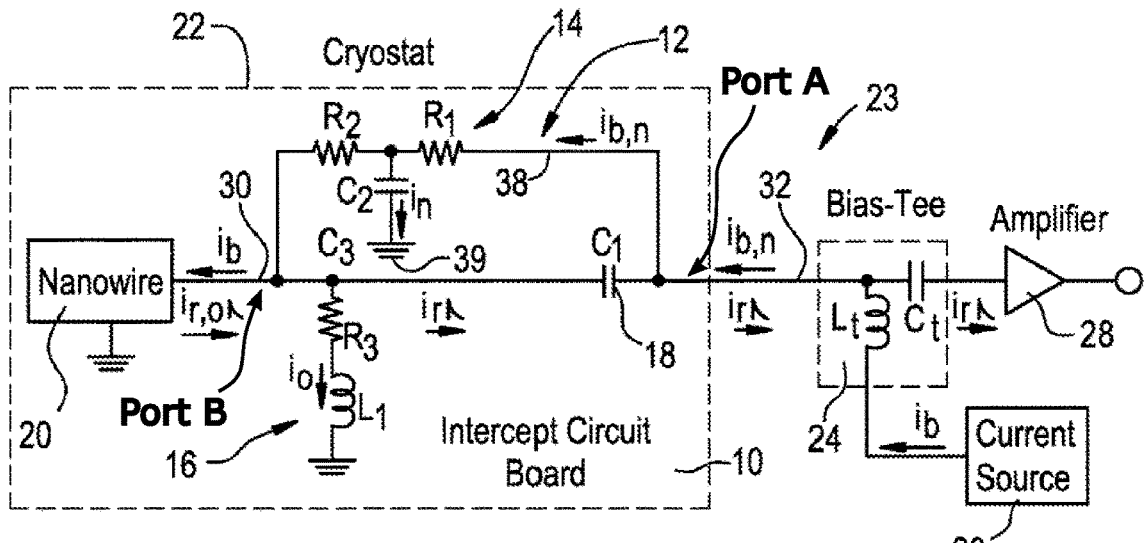
FIG. 1 is a circuit diagram of a cryogenic intercept board that comprises a noise suppressing interface circuit which is in accordance with an embodiment of the present invention.

While this invention may be susceptible to embodiment in different forms, there are shown in the drawings and will be described herein in detail, specific embodiments with the understanding that the present disclosure is to be considered an exemplification of the principles of the invention, and is not intended to limit the invention to that as illustrated.

FIG. 1 is a circuit diagram of a cryogenic intercept board 10 that comprises an interface circuit 12 that is in accordance with an embodiment of the present invention. As shown, the interface circuit 12 preferably comprises two low-pass filters 14, 16 in parallel to each other with a blocking capacitor 18 in series with one of the low-pass filters 16. The circuit 12 is preferably disposed on the intercept circuit board 10, and is connected in series with a nanowire 20, in a cryostat 22. The intercept circuit board 10 is preferably in communication with devices in a non-cryostat environment 23, such as connected to a bias-tee 24 which receives an input from a current source 26 and provides an output to an amplifier 28 or some other device. Preferably, the connection 30 from the nanowire 20 is a single coax or an equivalent conductor pair, as is the connection 32 to the bias-tee 24.

The interface circuit 12 is configured to provide that a superconducting nanowire single-photon detector is biased and read-out with a single coaxial channel 32 at the vacuum feedthrough of the cryogenic system 22. Specifically, the current source 26 generates a dc bias current $i_b$ and injects it into this coaxial channel 32 via the inductive arm of the bias-tee 24. Inside the cryostat 22, a circuit board 10 intercepts $i_b$ at an intermediate cold stage (25K). The blocking capacitor 18 ($C_1$) shunts the bias along a trace with the one low-pass filter 14 that is preferably comprised of two resistors $R_1$ and $R_2$ split by a capacitor $C_2$ to ground (or other current return path) (either of which is represented by reference numeral 39 in FIG. 1 despite the appearance of the ground symbol), which functions to suppress noise currents. The suppression of noise currents can also be realized by using a single resistor, inductor, or appropriate resistor-capacitor-inductor combination to suppress currents induced by room-temp noise voltages. Regardless of the exact components used to form the low-pass filter 14, the low-pass filter 14 is configured to allow the bias current to pass, while suppressing voltages induced via thermal or environmental noise currents propagating from the room temperature electronics 23. The dc-shunted path then re-combines with the capacitively coupled path and there are two more paths to ground: Path 1 being through the other low-pass filter 16, preferably comprised of a resistor $R_3$ (wherein $R_3 \ll R_1+R_2$) and inductor $L_1$, and Path 2 being through the coaxial connection 30 to the nanowire device 20 at the coldest stage of the cryostat 22 (~2.5K). Although the low-pass filter 16 is shown as being comprised of a resistor $R_3$ and inductor $L_1$, the same result can be achieved using other structures such as a single resistor or a single inductor.

Because the nanowire 20 is superconducting, path 2 (via connection 30) is a short to ground, so $i_b$ travels through the nanowire 20. When the nanowire device 20 absorbs a photon, it becomes resistive and generates an electrical pulse $i_r+i_o$ with a sharp rising edge and an exponential decay. This pulse is returned to the intercept board 10, and the low frequency components $i_o$ are immediately grounded through the low-pass filter 16 (i.e., through $R_3$ and $L_1$) while the high frequency portion $i_r$ passes through the blocking capacitor 18 ($C_1$), out of the cryostat 22 through the coaxial feedthrough 32, and through the bias-tee 24 to the ac-coupled amplifier chain 28.

The intercept board 10 shown in FIG. 1 can also accommodate active circuitry on the high-speed line, such as for processing the output of the device, amplifiers, logic gates, discriminators, etc.

Figure 2:
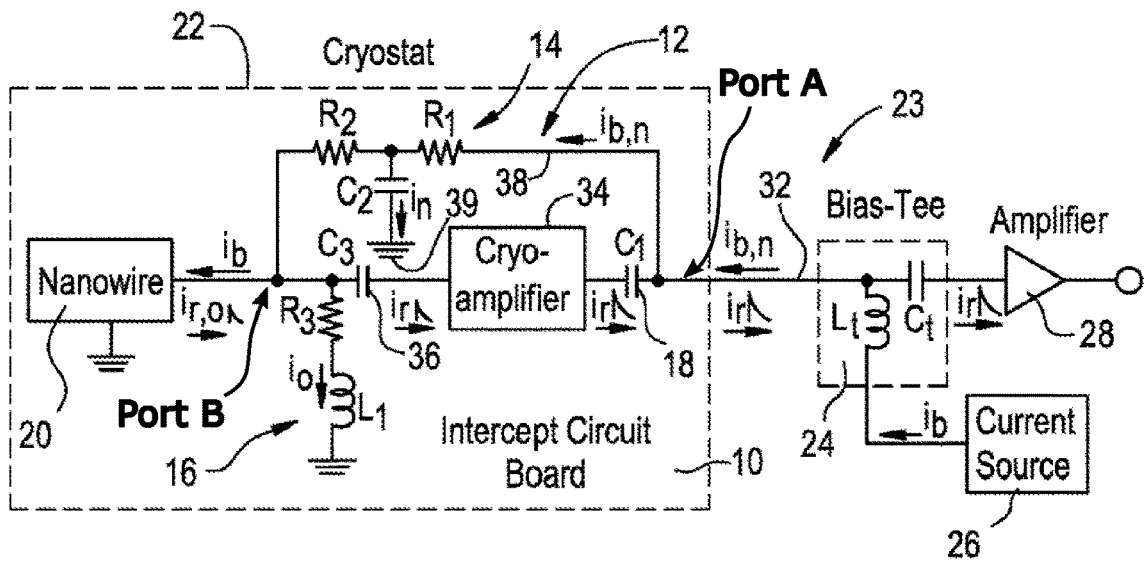
FIG. 2 is a circuit diagram which is similar to FIG. 1, but shows the inclusion of a cryogenic amplifier on the intercept board.

For example, FIG. 2 shows the intercept board 10 being used with an integrated cryogenic amplifier 34. As shown, all other components can be the same as what is shown in FIG. 1 (thus identical reference numbers are used), but preferably an extra capacitor 36 ($C_3$) is provided to help tailor the spectrum of the signal which impinges on the cryogenic amplifier circuit 34.

Regardless, the placement of a low-pass filter or high-impedance shunt line which takes place on the intercept board 10 is novel and crucial for several reasons. For example, the low-pass filter 14 in the dc-shunt line 38 decreases noise fluctuations propagating from room temperature 23 (these could stem from thermal noise, ground-loops, external sources of electromagnetic interference, and power-line noise generated by devices on the same outlet, power strip, or breaker) allowing for better device performance. Furthermore, without the intercept noise suppression provided by the low-pass filter 16 (i.e., realized in both FIGS. 1 and 2 by $R_3$ and $L_1$), $i_o$ can cause charging of the input capacitor to ac coupled amplifier chains 28 if it is below the cut-on frequency of the capacitor. When photons are impinging on the detector frequently, i.e. at a high average rate, the amp chain input capacitor can become charged. This charged capacitor works to create a back-current to the device which adds to $i_b$, shifting the optimal setting of the bias current source as a function of average optical signal detection rate. The low-pass filter 14 (i.e., to ground) on the intercept board 10 reduces or eliminates the charging of the coupling capacitors and significantly reduces the detection-rate dependence of the biasing.

The intercept board 10 shown in FIGS. 1 and 2 introduces a high impedance dc signal-path between the detector and room temperature electronics at cryogenic temperatures suppressing room-temperature noise sources and reducing generation of back currents from amplifier chains and reducing the number of electrical channels required. This point also holds true for other combinations of thermal environments and even in cases where the environments are thermally similar but with different noise sources.

Typical operation of a cryogenic amplifier with a nanowire detector is achieved by placing a cryogenic bias tee between the nanowire and the amplifier. Therefore, separate input and output electrical channels are needed at the vacuum feedthrough. The complexity of the wiring is a very important consideration because, the amount of wiring going into/out of a cryostat is often a limiting factor for how many superconducting devices can operate at once (limiting the number of optical channels, or the size of a multi-element detector array). The present invention is directed to cutting the required number of electrical channels required per detector, which can dramatically affect the scope and performance of a nanowire detector system.

Figure 3:
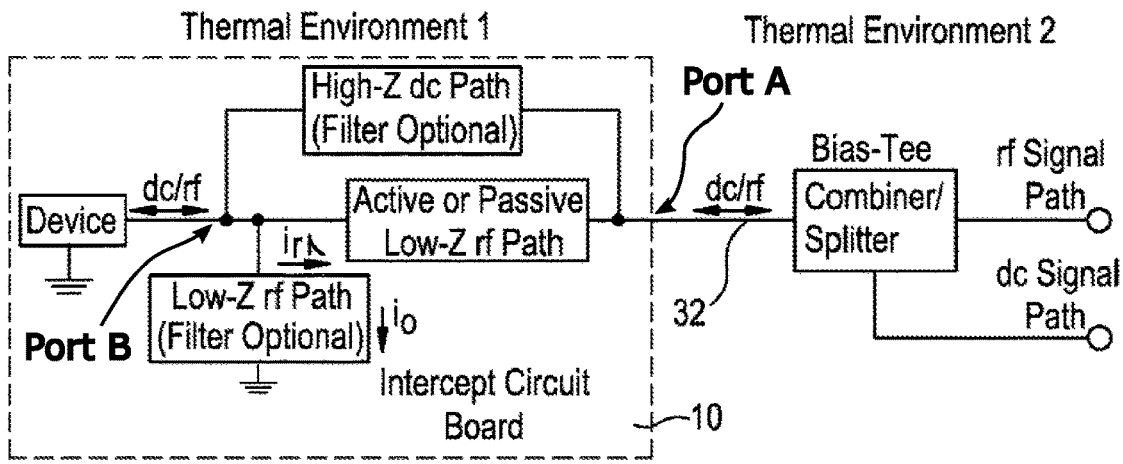
FIG. 3 is a circuit diagram which is similar to FIGS. 1 and 2, but provides more of a general schematic, showing general implementation of an embodiment of the present invention in association with two different thermal environments.

This technique can yield the same reduction in wiring complexity for interfacing other types of circuits, existing in separate environments with different temperatures and/or noise sources. FIG. 3 is a circuit diagram which is similar to FIGS. 1 and 2, but provides more of a general schematic, showing general implementation of an embodiment of the present invention in association with two different thermal environments ("Thermal Environment 1" and "Thermal Environment 2"). Regarding the use of a high impedance dc bypass line 32 in FIG. 3, dc currents induced by metallic connections between two different thermal environments are reduced by the high impedance dc path between those two temperatures, allowing very sensitive device biasing without negative effects from these currents. Additionally, recombining the dc path with the rf path on the device side of the blocking capacitor $C_1$, allows for the combination of device bias and device output into a single electrical channel 32 rather than two separate channels.

In FIG. 3, the "active or passive low-Z rf path" could contain circuit elements which modify behavior of the device (such as a nanowire) under test. For example, the addition of an inductor to ground or series resistor would reduce the L/R time-constant of a nanowire device, speeding up the electrical recharge and shortening detector dead-time.

An embodiment of the present invention allows for placement of a dc/rf circuit very close to the device so that local impedance can be different than normal wiring impedance, and functions to eliminate coupling of noise sources between different thermal environments, i.e. by reducing noise on bias currents for superconducting sensors. The present invention can be used to dc couple superconducting sensor output while using a single-combined dc/rf line for wiring the majority of the signal path (including at vacuum feedthroughs where the number of wires can be limited), and can be used to enable signal combining to read-out more complex sensor and amplifier circuits to be operated through a single-line.

An embodiment of the present invention provides a circuit which operates cold for doing biasing with suppression of noise currents from room temperature noise voltages and dc coupled rf readout of a superconducting device under test with a single coaxial cable or equivalent conductor pair. This is important because it reduces wiring cost, heat loading, and wiring complexity. The last point is especially important because cryogenic devices are being scaled to larger and more complex systems and pushed into ever smaller coolers. While all three points are highly relevant, finding the physical space to get all the wiring in is probably the most important limiting factor for determining how small of a cooler can be used or how many devices can be incorporated into a system.

A circuit in accordance with an embodiment of the present invention can also incorporate other elements for processing the output of the device, amplifiers, logic gates, discriminators, etc. This is particularly useful with regard to incorporation of a cryogenic amplifier, as shown in FIG. 2. The typical method for incorporating a cryogenic amplifier is to have a bias tee between the cold device and the amplifier with two coax lines running to the electrical feedthrough of the cryostat (one for bias and one for rf) in addition to the power line required for the amplifier. In the implementation disclosed herein, the bias teeing is provided by a circuit which needs only one coax for the dc and rf in addition to the amp power coax.

An embodiment of the present invention provides that a single transmission line is utilized to perform dc biasing and provide a pulsed readout of a low temperature device. On the intercept board, there is provided a high impedance, noise-immune, path for the dc bias current as well as a low-impedance path to ground (or other return path) for dc coupling the device output and a low-impedance path for high-speed outputs. The fact that these low-impedance and high-impedance paths are shorted together at the ends allows for the use of a single transmission line to interface with room temperature electronics for device operation. Without the intercept board as shown in FIGS. 1-3, a cold bias tee and two separate transmission lines would be required. Because of heat loads and physical space requirements in compact cryogenic systems, this two-to-one reduction is significant.

While it at times herein this disclosure explicitly refers to receiving a signal from a nanowire, there could be other types of devices sending a signal to the board. The embodiments disclosed herein can effectively be used in connection with any application that has dc biases and rf outputs.

While it at times herein this disclosure explicitly refers to specific cryogenic temperatures of 25K and 2.5K, the embodiments disclosed herein will work at other intermediate temperatures and base-stage temperatures and also when operated at the same temperature.

The present invention provides for the restriction of the propagation of dc on the signal lines. An embodiment of the present invention provides that non-superconducting circuitry is used for everything except the target device, and resistance, capacitance, and magnetic inductance is used to construct the circuit.

While specific embodiments of the invention have been shown and described, it is envisioned that those skilled in the art may devise various modifications without departing from the spirit and scope of the present invention.

What is claimed is:

1. A noise suppressing interface circuit which receives low-frequency signals and RF signals comprising: Port A through which a DC bias is incident and RF signals exit; Port B through which the DC bias exits the circuit and RF signals enter; a first low-pass filter; at least one blocking capacitor which is configured to shunt the DC bias received through Port A using a first low-pass filter, wherein the first low-pass filter is configured to allow the DC bias to pass either to ground or to another return-current path while suppressing thermally induced noise from propagating to Port B, wherein the noise suppressing interface circuit provides a first path to ground which is through a sensor or other load via direct connection to Port B of the circuit, a second path to ground which is through a second low-pass filter with significantly lower impedance than the first low-pass filter, and a capacitively coupled RF path from Port B to Port A, wherein low frequency signals entering the circuit from Port B get shunted directly to ground through the second low-pass filter due to the impedance in the first low-pass filter, but RF signals entering the circuit from Port B experience a high pass filtering as they pass directly though the capacitively coupled RF path to Port A.

2. A noise suppressing interface circuit as recited in claim 1, wherein the first low-pass filter comprises two resistors split by a capacitor to either ground or the return-current path.

3. A noise suppressing interface circuit as recited in claim 1, wherein the output comprises a single coaxial cable.

4. A noise suppressing interface circuit as recited in claim 1, wherein the output comprises a single conductor pair.

5. A noise suppressing interface circuit as recited in claim 1, wherein the second low-pass filter comprises at least one resistor.

6. A noise suppressing interface circuit as recited in claim 1, wherein the second low-pass filter comprises a resistor and inductor.

7. A noise suppressing interface circuit as recited in claim 1, wherein the noise suppressing interface circuit is configured to provide that a superconducting nanowire single-photon detector is biased and read-out with a single coaxial channel at a vacuum feedthrough of a cryogenic system.

8. A noise suppressing interface circuit as recited in claim 1, wherein a current source generates a dc bias current and injects said dc bias current into the output via an inductive arm of a bias tee.

9. A noise suppressing interface circuit as recited in claim 1, wherein the noise suppressing interface circuit is disposed on an intercept circuit board.

10. A noise suppressing interface circuit as recited in claim 1, wherein the noise suppressing interface circuit is disposed on an intercept circuit board along with a cryogenic amplifier.

11. A noise suppressing interface circuit as recited in claim 1, wherein the noise suppressing interface circuit is disposed on an intercept circuit board, wherein a cryogenic amplifier is disposed on the intercept circuit board, wherein the cryogenic amplifier is disposed between the at least one blocking capacitor and the second low-pass filter.

12. A noise suppressing interface circuit as recited in claim 1, wherein the noise suppressing interface circuit is disposed on an intercept circuit board, wherein the intercept board is configured to receive a nanowire input and is configured to provide a biased output along a single coaxial wire to a bias tee.

13. A noise suppressing interface circuit as recited in claim 1, wherein the first and second low-pass filters are connected in parallel to each other.

* * * * *